United States Patent [19]
Blalock et al.

[11] Patent Number: 5,945,348
[45] Date of Patent: Aug. 31, 1999

[54] METHOD FOR REDUCING THE HEIGHTS OF INTERCONNECTS ON A PROJECTING REGION WITH A SMALLER REDUCTION IN THE HEIGHTS OF OTHER INTERCONNECTS

[75] Inventors: Guy Blalock; Scott Meikle, both of Boise, Id.; Sung Kim, Pflugerville, Tex.; Kirk Prall, Boise, Id.

[73] Assignee: Micron Technology, Inc., Boise, Id.

[21] Appl. No.: 08/626,278

[22] Filed: Apr. 4, 1996

[51] Int. Cl.$^6$ .................................................. H01G 13/00
[52] U.S. Cl. .......................... 438/692; 438/386; 438/393; 438/430; 438/622; 438/633; 438/697; 438/760; 438/902; 438/959; 216/6; 216/18; 216/89
[58] Field of Search .................................. 216/6, 18, 19, 216/38, 39, 53, 89, 99; 438/386, 393, 396, 430, 622, 626, 633, 692, 697, 760, 902, 959

[56] References Cited

U.S. PATENT DOCUMENTS

| | | | |
|---|---|---|---|
| 4,824,521 | 4/1989 | Kulkarni et al. | 438/625 |
| 5,055,158 | 10/1991 | Gallagher et al. | 216/3 |
| 5,270,241 | 12/1993 | Dennison et al. | 438/396 |
| 5,302,233 | 4/1994 | Kim et al. | 438/692 |
| 5,411,909 | 5/1995 | Manning et al. | 438/152 |
| 5,529,946 | 6/1996 | Hong | 438/253 |
| 5,685,947 | 11/1997 | Tseng et al. | 216/88 |

*Primary Examiner*—Bernard Codd
*Attorney, Agent, or Firm*—Seed and Berry LLP

[57] ABSTRACT

A region is formed in a semiconductor substrate and extends beyond the substrate surface. First and second interconnects each having a predetermined thickness and a surface approximately parallel to the substrate surface are formed on the region. The first and second interconnects define a trench therebetween. A third interconnect is formed on the substrate. The thicknesses of the first and second interconnects are reduced a first amount to improve the aspect ratio of the trench, to improve the cross-sectional profile of the trench, or both. The thickness of the third strip is reduced a second amount. The second amount may be smaller than the first amount.

9 Claims, 4 Drawing Sheets

METHOD FOR REDUCING THE HEIGHTS OF INTERCONNECTS ON A PROJECTING REGION WITH A SMALLER REDUCTION IN THE HEIGHTS OF OTHER INTERCONNECTS

TECHNICAL FIELD

The invention relates generally to methods for forming a semiconductor structure, and more specifically, to a method for forming a semiconductor structure having a trench with a reduced aspect ratio, a reduced retrograde, or both.

BACKGROUND OF THE INVENTION

In order to fit more circuitry on a semiconductor wafer, semiconductor process engineers are steadily reducing the dimensions of the elements that compose integrated circuits and of the spaces and trenches that separate these elements. These integrated elements may include, for example, transistors and conductive coupling interconnects, such as conductive paths or lines. Such a decrease in the trench dimensions, particularly the trench width, often causes a number of problems. For example, the decrease in trench width may increase the difficulty of filling a trench with a material or of removing the material from the trench. As discussed below in conjunction with FIG. 1, residue or stringers of conductive material that are not removed from a trench may cause short circuits between circuit elements. Such problems and conventional solutions thereto are discussed in U.S. Pat. No. 5,302,233, which is entitled "Method for Shaping Features of a Semiconductor Structure Using Chemical Mechanical Planarization (CMP)," issued on Apr. 12, 1994, and is incorporated by reference herein.

FIG. 1 is a cut away top view of a portion 10 of a semiconductor device, such as a dynamic random access memory (DRAM), having reduced element and trench dimensions. Portion 10 includes three word interconnects or lines 12a–c, which are formed on a substrate 13 and carry signals that fire respective rows of memory cells (not shown) when an external device, such as a processor (not shown), addresses these rows. A field oxide region 14 isolates active substrate areas 16a–b from one another. The word lines 12 are often etched from one or more layers that are formed on the substrate 13 and the field regions 14. Such etching forms trenches 20 between adjacent word lines 12. As shown, the trenches 20 are narrowest where the word lines 12 cross over the field oxide 14. Typically, storage-cell transistors (not shown) are formed in the active areas 16. Plates 18a–b of data storage capacitors associated with active areas 16a–b respectively are formed from a layer of conductive material, such as polysilicon, that is deposited over the word lines 12, field region 14, and active areas 16.

Because the aspect ratios (i.e., depth or height to width ratio) for the trenches 20 are often relatively large, and because the cross-sectional profiles of the trenches 20 are often retrograde, it is often difficult to remove material that has been deposited within the trenches 20. A retrograde, i.e., "bottle neck", cross-sectional profile occurs when the width of the opening to the trench 20 is smaller than the width of the trench 20 beneath the opening. The residue of the conductive material within a trench 20 may form a short circuit, i.e., stringer 22, between two or more capacitor plates 18, and render defective each of the memory cells associated with a respective one of the shorted plates 18. For example, the stringer 22, if present, may render defective both of the memory cells associated with capacitor plates 18a and 18b, respectively.

One technique for removing the conductive material from the trenches 20, and thus reducing or eliminating the formation of the stringers 22, is overetching the layer of conductive material during the formation of plates 18. Such overetching, however, typically reduces the area of plates 18, and thus reduces the storage capacity of the storage capacitors.

SUMMARY OF THE INVENTION

In accordance with one aspect of the present invention, a method is provided for forming a semiconductor structure. A region is formed in a substrate, and projects out of the substrate surface. First and second interconnects each having a predetermined thickness and a surface approximately parallel to the substrate surface are formed on the region. The first and second interconnects define a trench therebetween. A third interconnect is formed on the substrate. The thicknesses of the first and second interconnects are reduced a first amount and the thickness of the third interconnect is reduced a second amount. In a related aspect of the invention, the second amount is less than the first amount.

In accordance with another aspect of the invention, the thicknesses of the first and second interconnects are reduced by polishing the approximately parallel surfaces.

In accordance with yet another aspect of the invention, the thicknesses of the first and second interconnects are reduced by polishing the approximately parallel surfaces, and the mouth of the trench is widened by polishing the edges between each of the approximately parallel surfaces and the sides of the respective first and second interconnects that face the trench.

In accordance with still another aspect of the invention, a layer of material is formed on the substrate and the region. The layer is planarized, and the first, second, and third strips are formed from the planarized layer.

An advantage provided by one aspect of the invention is a reduction in the aspect ratios of trenches between adjacent integrated elements.

An advantage provided by another aspect of the invention is an improvement in the cross-section profile of the trenches between adjacent elements.

An advantage provided by still another aspect of the invention is making the surfaces of the interconnects perfectly or nearly perfectly planar. Such planarity allows the use or increases the effectiveness of subsequent etch and CMP processes that are designed to end at the interconnect surfaces or in layers or materials on the interconnect surfaces.

An advantage provided by yet another aspect of the invention is a planarized surface that provides a wider process margin for photolithography.

BRIEF DESCRIPTION OF THR DRAWINGS

DETAILED DESCRIPTION OF THE INVENTION

The invention is a process for forming a semiconductor device, such as a DRAM. In one aspect of the invention, the thickness of the interconnects or word lines is reduced where they cross the field oxide to reduce the trench 20 aspect ratios, and also to form the surfaces of the interconnects at the same or approximately the same height from the substrate, regardless of the topology underlying the word lines. In a related aspect of the invention, the layers from which the word lines are formed are leveled in the areas overlying the field oxide to produce a similar result. In another aspect of the invention, the trench openings are widened to reduce the severity of or eliminate altogether the retrograde profiles of the trenches 20.

In another aspect of the invention, the interconnects are planarized after side-wall spacers have been formed to create a substantially flat and square non-retrograde profile of the trenches 20. Such a profile often improves the process margin for subsequent self-aligned etches, which in one aspect of the invention may be used to form self-aligned contacts within one or more of the trenches 20 that overlay an active area of the substrate.

Figure 2:
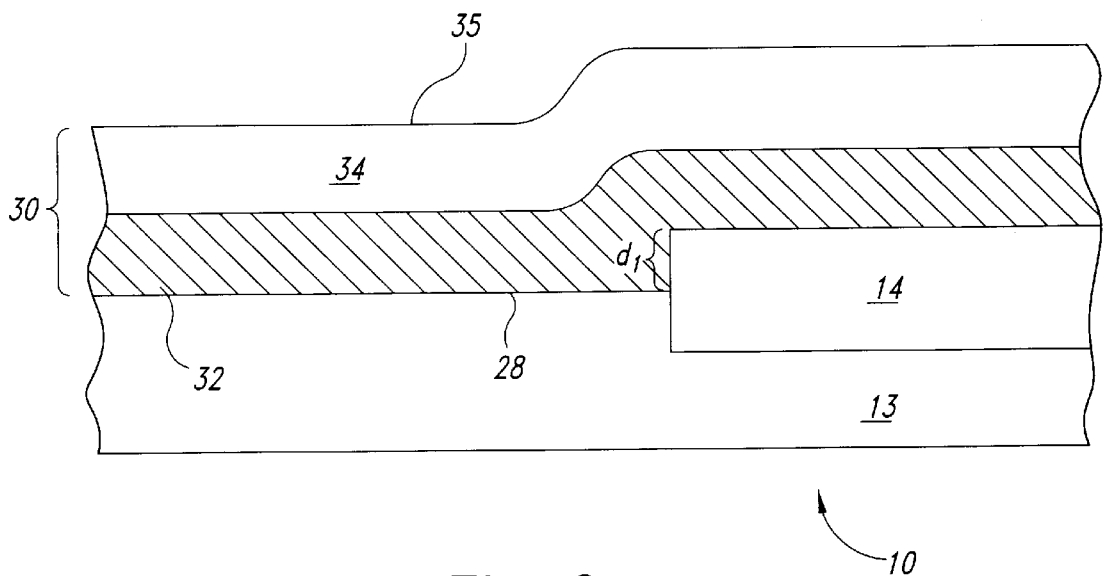
FIG. 2 is a cross-sectional view of the device portion of FIG. 1 taken along the line 2—2 before the formation of the word lines.

FIG. 2 is a cross-sectional view of the portion 10 that illustrates the initial process steps in the formation of a semiconductor device, such as a DRAM. First, the isolating region 14, such as a field oxide isolation region, is grown in the substrate 13, which is formed from semiconductor material. Depending upon the specific process used, the substrate 13 may be doped either p-type or n-type in a conventional manner and concentration. The field oxide 14 may be grown using the LOCOS process or any other conventional process. As shown, the field oxide region 14 extends a distance $d_1$ above the surface 28 of the substrate 13.

After the formation of the field oxide region 14, a layer 30 is formed in a conventional manner on the substrate 13 and the field oxide 14. In a preferred embodiment of the invention, the layer 30 is a composite layer having an intermediate layer 32 of a conductive material, such as polysilicon, and an outer layer 34 of an insulator material such as silicon dioxide, silicon nitride, aluminum oxide, an organic polymer, or other suitable materials. The intermediate layer 32 is often doped in a conventional manner to increase the conductivity thereof As shown, the layer 30 is often nonplanar because its outer surface 35 extends farther from the substrate surface 28, i.e., is higher, over the field oxide 14 than over the surface 28. In one aspect of the invention, the layer 30 is planed or leveled before it is etched. In a preferred embodiment of this aspect of the invention, a chemical mechanical polishing or planarization (CMP) process is used to planarize the layer 30.

Suitable CMP apparatus (not shown) for planarizing the layer 30 are known in the art. One such suitable CMP apparatus is manufactured by Westech Engineering and is designated as a model 372 polisher. Typically, the CMP apparatus includes as rotatable polishing head for holding the substrate 13 and a rotatable polishing pad for contacting the layer 30. With such an apparatus, the layer 30 is held against the polishing pad with a controlled pressure. A chemical slurry is metered onto the polishing pad to provide chemical etchants and an abrasive medium. As an example, for polishing an oxide layer, the chemical slurry may contain silica or alumina particles suspended in solution. Chemical slurries for other materials may include silicon carbide and diamond particles. In general, with such a CMP apparatus, all process functions of the apparatus (e.g., rotational speed, force, temperature, and slurry composition) are under computer control. CMP techniques and apparatus are also discussed in U.S. Pat. No. 5,302,233, which was previously incorporated by reference.

Figure 3:
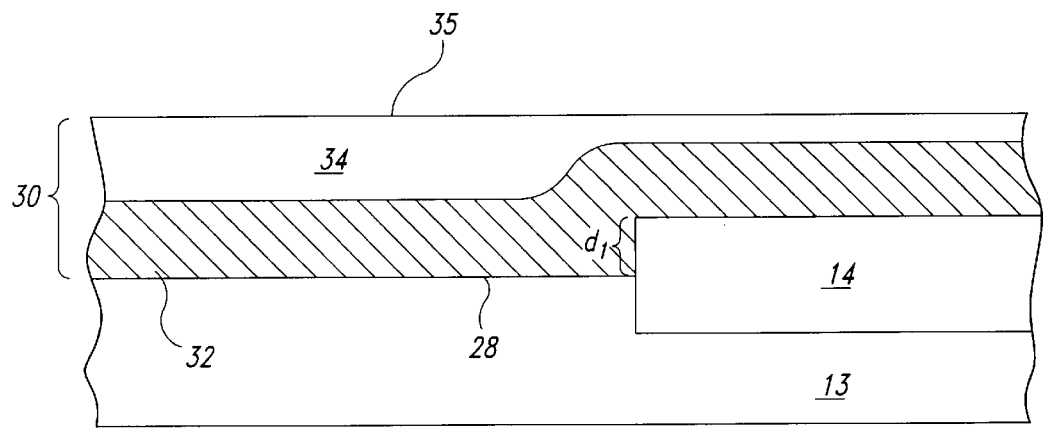
FIG. 3 is the device portion of FIG. 2 after the planing of the deposited layer.

There are many ways to planarize the layer 30 using the abovedescribed CMP techniques. For example, in a preferred embodiment of the invention as shown in FIG. 3, one may polish the outer layer 34 until it, and thus the layer 30, are substantially level. Or, before the outer layer 34 is formed, one may polish the intermediate layer 32 until it is substantially level. Because the layer 34 is then formed on a substantially planar layer 32, the layer 34, and thus the layer 30, are also substantially planar.

Figure 1:
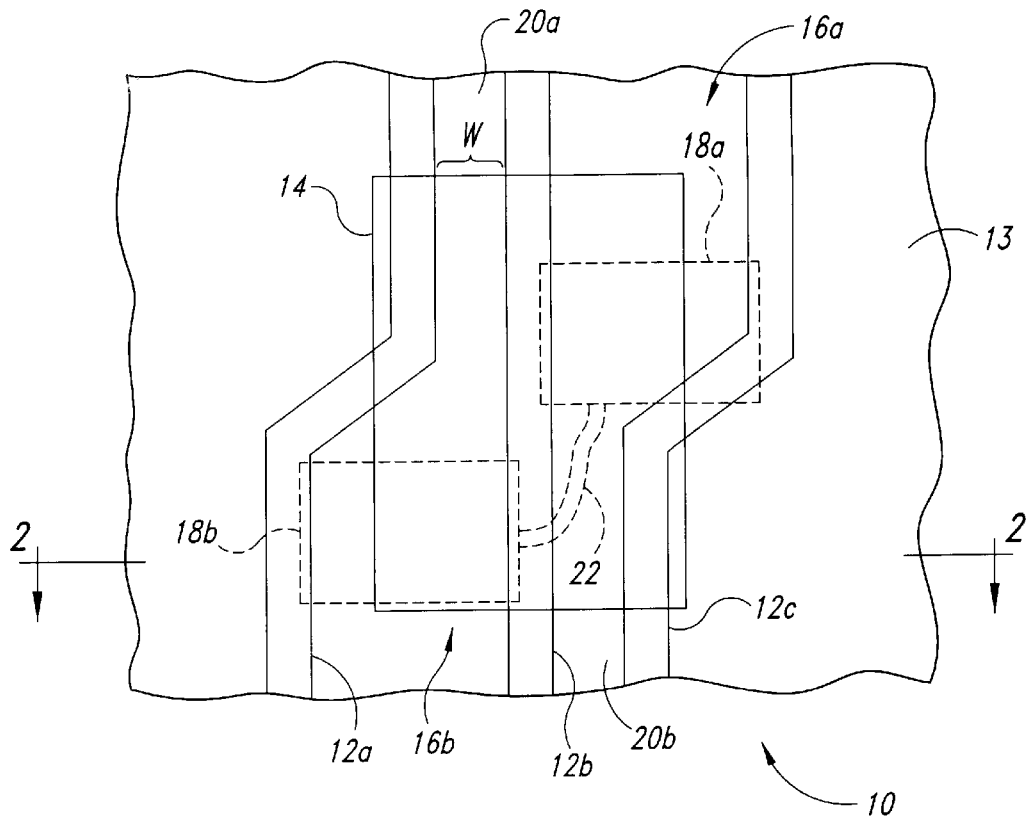
FIG. 1 is a cutaway top plan view of a portion of a semiconductor device such as a DRAM.

In addition to reducing the aspect ratios of trenches 20 (FIG. 1), which are formed when the word lines 12 are etched from the layer 30, such planarizing of the layer 30 reduces or eliminates inaccuracies in the photoresist etch mask (not shown) for the layer 30. Often, the depressions between the peaks of the unlevel layer 30 form parabolic bowls. During the photolithography for forming the etch mask for the layer 30, these bowls may focus light in such a way as to cause an erroneous exposure (or nonexposure, depending upon whether positive or negative photoresist is used) of the photoresist. Such erroneous exposure may cause unwanted mask openings (or unwanted mask formation in the case of negative photoresist) that allow etching (or nonetching) of portions of the layer 30 that should not (should) be etched.

In still another aspect of the invention, the layer 30 is not planarized before it is etched.

Figure 4:
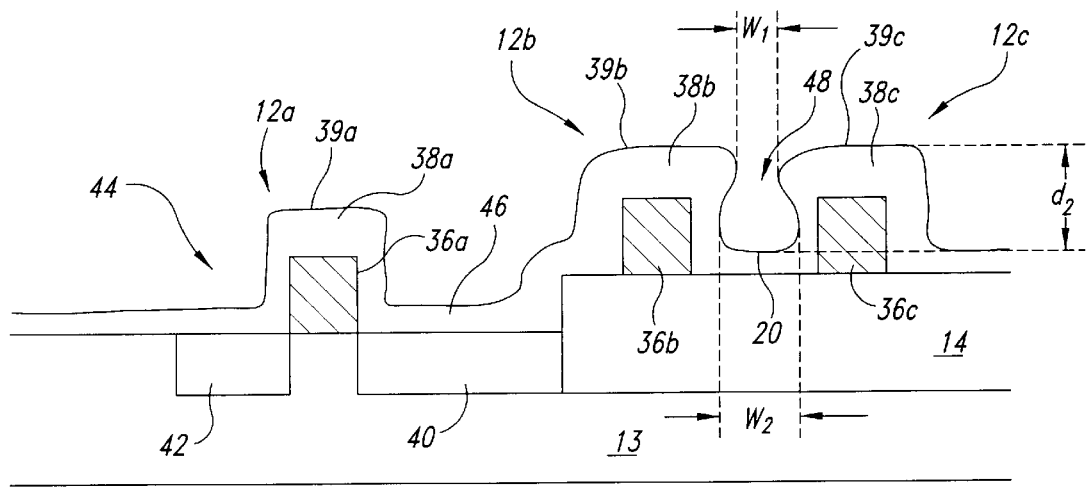
FIG. 4 is the device portion of FIG. 2 after the formation of the word lines.

Referring to FIG. 4, after the formation of the photoresist mask, the layer 30 is etched to form the interconnects that form the word lines 12, which include conductive portions 36 that are formed from the layer 32 and oxide caps 38 that are formed from the layer 34. The oxide caps 38b–c are shown for a process where the layer 30 was not planarized before it was etched. The oxide caps 38 have surfaces 39 that are approximately parallel to the surface 28 of the substrate 13, although the surfaces 39 may be slightly rounded. Such rounding is often referred to as a breadloafing or cusping. After the formation of the word lines 12, the substrate 13 may be selectively doped in a conventional manner to form a source region 40 and a drain region 42 of a storage-cell transistor 44. The word line 36a acts as the gate of the transistor 44. After the formation of the transistor 44, a layer 46 of insulator material such as silicon dioxide is formed over the exposed portions of the substrate 13, the conductive portions 36, and the oxide caps 38. In another aspect of the invention, the outer layer 34 of layer 30 may be omitted, and the oxide caps 38 may be completely formed from the layer 46 or another insulative layer. Other materials suitable for the layer 46 include silicon nitride, aluminum oxide and an organic polymer.

After the formation of the layer 46, the trench 20 between adjacent word lines 36b and 36c has a thickness or height of $d_2$ and a width at its mouth or opening 48 of $w_1$. As shown, the trench 20 has a retrograde profile by virtue of the width $w_1$ of its mouth 48 being narrower than the width $w_2$ of its inner portions. The large value of $d_2$ and the comparatively small value of $w_1$ significantly increase the difficulty of completely filling the trench 20 with a material without leaving any gas pockets therein or of completely clearing the trench 20 of the material without leaving stringers 22.

Figure 5:
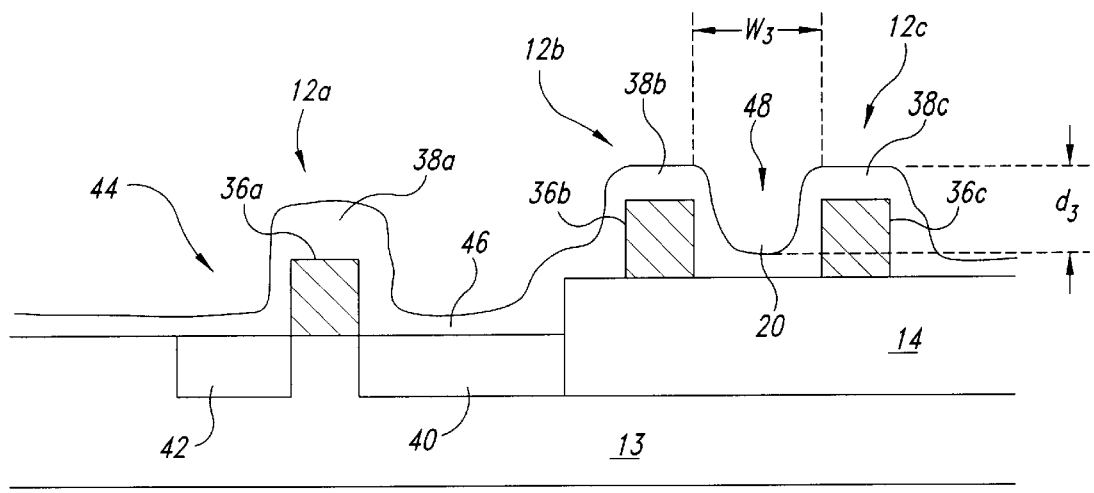
FIG. 5 is the device portion of FIG. 4 after the reduction in thickness of some of the word-line oxide caps.

Referring to FIG. 5, the oxide caps 38b and 38c are chemically and mechanically polished to facilitate the filling or clearing of the trench 20. In one aspect of the invention, the caps 38b and 38c are polished using a relatively stiff pad to substantially reduce their thicknesses. This reduction in the thicknesses of caps 38b and 38c reduces the height of the trench 20 from $d_2$ (as shown in FIG. 4) to $d_3$, and thus reduces the aspect ratio of the trench 20.

Still referring to FIG. 5, in another aspect of the invention, the oxide caps 38b and 38c are chemically and mechanically polished using a relatively soft, i.e., flexible, pad that not only reduces the thicknesses of the caps 38b and 38c, but also rounds the edges of the oxide caps 38b and 38c to widen the mouth 48 from $w_1$ (as shown in FIG. 4) to $w_3$, and to thus eliminate the retrograde profile of the trench 20. That is, the mouth 48 is widened by polishing the boundaries or edges between each of the substantially parallel surfaces 39b and 39c and the respective side of the word lines 12b and 12c that faces the trench 20 and thus forms a side wall of the trench 20. The reduction in its aspect ratio, the elimination of its retrograde profile, or the combination of both, greatly increases the likelihood that the trench 20 can be completely filled with a material or be completely cleared of a material without a severe over etching or other drastic removal processes.

Although the characterization of the pad as soft is a matter of degree, in general, the pad should be soft enough to conform to the bread loaf contours of the surfaces 39 of the caps 38 and to flow into the opening 48 of the trench 20. Furthermore, by increasing the stiffness of these soft polishing pads, the degree of contouring and shaping can be controlled. Suitable soft polishing pads typically have an open pore structure and are formed from a felt-based material that is impregnated with polyester urethane. One suitable type of polishing pad is the Polytex Supreme® marketed by Rodel Products Corporation. Such soft pads are also discussed in U.S. Pat. No. 5,302,233, which was previously incorporated by reference.

Still referring to FIG. 5, because chemical and mechanical polishing is highly selective to the higher portions of a structure, the thicknesses of the caps 38b and 38c are reduced, while the thickness of the cap 38a remains substantially the same as before the chemical and mechanical polishing step. Such selectivity provides the advantages discussed below in conjunction with FIG. 6.

Figure 6:
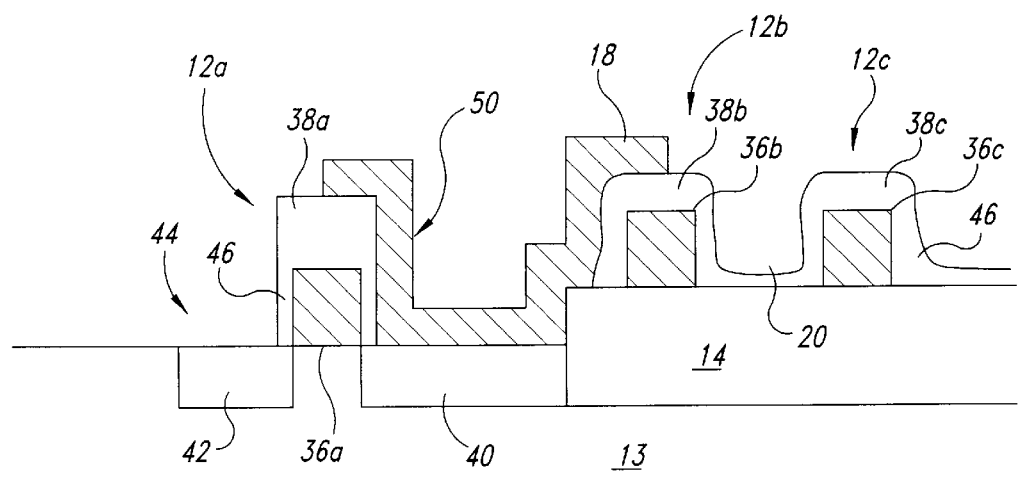
FIG. 6 is the device portion of FIG. 5 after the formation of the bottom capacitor plates.

Referring to FIG. 6, after the oxide caps 38b and 38c have been chemically and mechanically polished, another mask is formed in a conventional manner and the portions of the oxide layer 46 that are formed on the source 40 and the drain 42 are removed. Next, a layer 50 of conductive material, such as polysilicon, is deposited over the substrate 13, the oxide caps 38a–c, and in the trench 20. Another mask is formed in a conventional manner, and the polysilicon layer is etched to form the bottom plate 18 of a storage capacitor. The improvements in either or both the aspect ratio and profile of the trench 20 facilitate the removal of the polysilicon within the trench 20. Thus, the polysilicon within the trench 20 can be removed without a heavy over etch. The lack of a heavy over etch increases the area of the plate 18 over similar plates formed by prior art techniques, and thus increases the capacitance of the storage capacitor. Such an increase in the area of the plate 18 more than compensates for the slight reduction in this area caused by the reduction in the thickness of the oxide cap 38b. Moreover, because it is not polished, the oxide cap 38a retains its full thickness, and the area of the plate 18 is not further reduced.

Figure 7A:
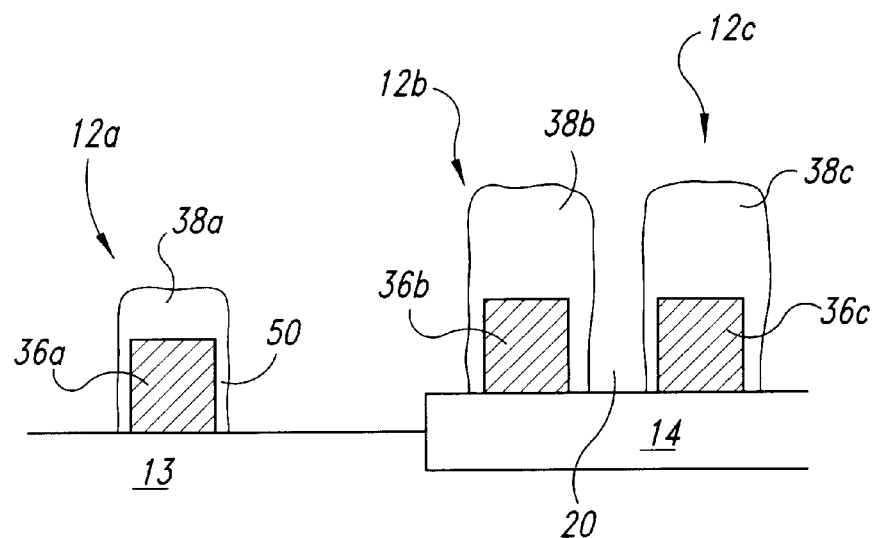
FIG. 7A is the device portion shown in FIG. 4 after the formation of the side-wall spacers.

Referring to FIG. 7A, another embodiment of the invention is shown where side-wall spacers 50 are formed along the side-walls of the conductive portions 36. In this embodiment of the invention, the word lines 12 are formed from the composite layer 30 (FIG. 2) before the layer has been chemically and mechanically polished. After the formation of the word lines 12, an oxide layer or other insulative layer is formed over the word lines 12 and the exposed surfaces of the substrate 13. This layer is then etched in a conventional manner, often using reactive ion etching (RIE), to form the side-wall spacers 50.

Figure 7B:
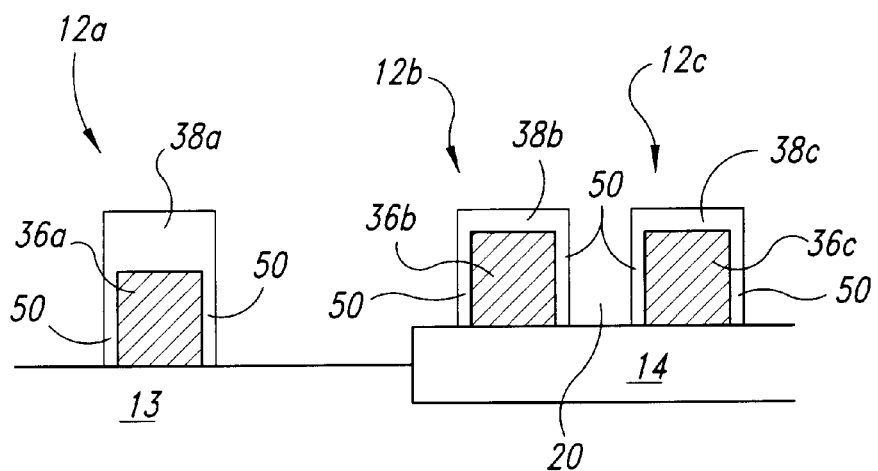
FIG. 7B is the device portion of FIG. 7A after a reduction in the thickness of the oxide caps.

Referring to FIG. 7B, the oxide caps 38 are chemically and mechanically polished to provide a substantially square profile for the word lines 12. Such a profile facilitates a self-aligned formation of the conductive contacts (not shown) to the substrate 13 between adjacent word lines 12. In one aspect of the invention, the word lines 12 are formed from a composite layer 30 that lacks the insulative layer 34. Thus, the caps 38a–c are not present. In such an aspect, after the formation of the side-wall spacers 50, the conductive portions 36a–c are chemically and mechanically polished to give the substantially square profile.

It will be appreciated that, although specific embodiments of the invention have been described herein for purposes of illustration, various modifications may be made without departing from the spirit and scope of the invention. Accordingly, the invention is not limited except as by the appended claims. For example, the described chemical and mechanical polishing techniques for planarizing the layer 30 (FIG. 2) and reducing the thickness and rounding the corners of the oxide caps 38b and 38c (FIGS. 3–5) can be used in processes that form semiconductor devices other than DRAMs. Furthermore, the interconnects that form the word lines 12 in the described semiconductor device may be formed from a single layer of material, i.e., the interconnects may be noncomposite.

We claim:

1. A method for forming a semiconductor device, comprising:

forming in a substrate having a surface a region that extends outwardly from said surface;

forming a level layer on said substrate and said region;

forming from said level layer on said region first and second interconnects defining a trough therebetween and each extending outwardly a first height from said substrate surface;

forming on said substrate from said level layer a third interconnect laterally spaced from said region and extending outwardly a second height from said substrate surface;

chemically and mechanically polishing said first and second interconnects to reduce said first height by a first amount and to widen an opening of said trough, said polishing reducing said second height by a second amount that is less than said first amount;

forming a layer of material over said substrate, region, and first, second, and third interconnects; and removing said material from said trough.

2. A method for forming a memory device, comprising:

forming in a semiconductor substrate having a surface an isolating region that projects outwardly from said substrate;

forming on said isolating region first and second word lines that define a trench therebetween, the first and second word lines respectively including first and second conductive portions having surfaces parallel to said substrate surface and first and second insulator caps formed on said surfaces of said first and second conductive portions, said first and second insulator caps having respective first and second thicknesses;

forming on said substrate a third word line including a third conductive portion having a surface parallel to said substrate surface and a third insulator cap formed on said surface of said third conductive portion and having a third thickness, said third word line being laterally spaced from said isolating region and adjacent to said second word line;

polishing said first and second insulator caps to widen an opening of said trench, said polishing reducing said first and second thicknesses more than said third thickness;

forming a layer of conductive material on said substrate, said isolating region, and said first, second, and third word lines; and removing said conductive material from said trench to form a capacitor plate between said second and third word lines.

3. The method of claim 2 wherein said forming first, second, and third word lines comprise:

forming an intermediate layer including polysilicon on said substrate and said isolating region;

forming an outer layer including an oxide on said intermediate layer; and etching said intermediate and outer layers to form said first, second, and third word lines.

4. The method of claim 2 wherein said forming first, second, and third word lines comprise:

forming an intermediate layer including polysilicon on said substrate and said isolating region;

leveling said intermediate layer;

forming an outer layer including an oxide on said leveled intermediate layer; and etching said intermediate and outer layers to form said first, second, and third word lines.

5. The method of claim 4 wherein said leveling comprises chemically and mechanically polishing said intermediate layer.

6. The method of claim 2 wherein said forming first, second, and third word lines comprise:

forming an intermediate layer including polysilicon on said substrate and said isolating region;

forming an outer layer including an oxide on said intermediate layer;

leveling said outer layer; and etching said intermediate and outer layers to form said first, second, and third word lines.

7. The method of claim 2 wherein said polishing comprises polishing edges of said first and second insulator caps that face said trench to widen said opening of said trench.

8. The method of claim 2 wherein said removing comprises etching said layer of conductive material to form said capacitor plate.

9. The method of claim 2 wherein said conductive material comprises polysilicon.

* * * * *